(12) United States Patent
Nakabayashi et al.

(10) Patent No.: US 6,500,683 B1
(45) Date of Patent: Dec. 31, 2002

(54) METHOD OF MEASURING TRENCH DEPTH OF SEMICONDUCTOR DEVICE

(75) Inventors: Masakazu Nakabayashi, Tokyo (JP); Tadayuki Yoshiyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/119,838

(22) Filed: Apr. 11, 2002

(30) Foreign Application Priority Data

Oct. 16, 2001 (JP) ........................................ 2001-317926

(51) Int. Cl.⁷ .......................... H01L 21/76; G01R 31/26
(52) U.S. Cl. .......................... 438/14; 438/243; 438/424
(58) Field of Search ........................... 438/14, 424, 243

(56) References Cited

U.S. PATENT DOCUMENTS

| | | | | |
|---|---|---|---|---|
| 6,157,078 A | * | 12/2000 | Lansford | .................... 257/734 |
| 6,388,756 B1 | * | 5/2002 | Ho et al. | .................... 356/626 |
| 2002/0060575 A1 | * | 5/2002 | Mehrad et al. | ............. 324/699 |

FOREIGN PATENT DOCUMENTS

| | | |
|---|---|---|
| JP | 63-228010 | 9/1988 |
| JP | 2-276904 | 11/1989 |
| JP | 1-123102 | 5/1999 |
| WO | WO 02/29356 A2 * 4/2002 | ........... G01B/11/00 |

* cited by examiner

Primary Examiner—Olik Chaudhuri
Assistant Examiner—David Blum
(74) Attorney, Agent, or Firm—Oblon, Spivak, McClelland, Maier & Neustadt, P.C.

(57) ABSTRACT

A method of directly measuring a trench depth without damages to a wafer is provided. First, the focus of a lens (LZ) of a microscope is adjusted so that a tip (TP) of a projection (PP) of a negative replica (NR) is plainly visible through the microscope, and a vertical position (A) of a stage (ST) at that time is identified. Next, with the lens (LZ) held at the same position, the stage (ST) is gradually moved toward the lens (LZ) and is stopped moving at a position where a surface (SF) of a base (BP) of the negative replica (NR) is plainly visible through the microscope. A vertical position (B) of the stage (ST) at that time is identified. Then, a difference between the vertical position (B) and the vertical position (A) is obtained to determine a distance (MD) moved, i.e., the height of the projection (PP). Since standard particles (SP) are diffused in the negative replica (NR) to make the negative replica (NR) opaque, it is easy to judge whether the tip (TP) of the projection (PP) or the surface (SF) of the base (BP) is at a focus position. This allows the obtainment of the correct distance (MD).

7 Claims, 6 Drawing Sheets

F I G . 7
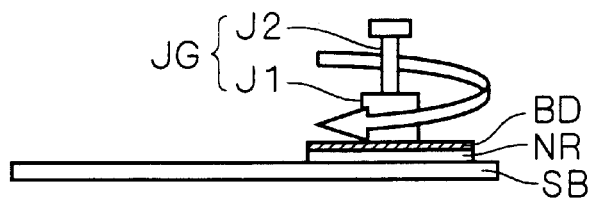
F I G . 8
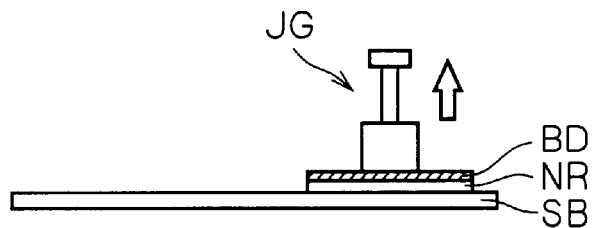
F I G . 9
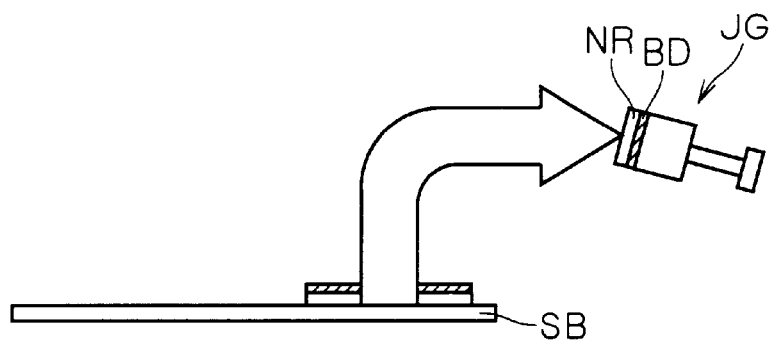

METHOD OF MEASURING TRENCH DEPTH OF SEMICONDUCTOR DEVICE

BACKGROUND OF THE INVENTION

1. Field of the Invention

The present invention relates to a method of measuring the depth of a trench for use in forming a trench capacitor and an isolating insulation film in a semiconductor device.

2. Description of the Background Art

In state-of-the-art semiconductor devices, a trench for use in forming an isolating insulation film, for example, has the following dimensions: a width of about 0.35 μm and a depth of about 3.5 μm. Thus, the aspect ratio of the depth to the width is about 10.

If a laser microscope using laser in an ultraviolet range is used for the trench having such a high aspect ratio, it is impossible to measure the depth of the trench since light reflected from the bottom of the trench is not detected.

The use of a scanning electron microscope (SEM) allows a user to three-dimensionally observe the trench. However, the SEM is not capable of directly measuring the dimensions, and it is hence required to employ an inaccurate technique of photographing a sample inclined at a predetermined angle, obtaining a measurement of the depth of the trench in the photograph, and correcting the measurement depending on the angle of inclination to calculate an actual trench depth.

Of course, cutting the sample at a trench portion and observing the cross-section of the trench portion through the SEM attain the measurement of the trench depth relatively accurately. This method, however, is impractical since the sample or wafer becomes unusable.

In view of the foregoing, there has typically been adopted a technique of forming test trenches to be monitored in other than a portion of the wafer wherein a semiconductor device is to be formed, e.g. in an end edge portion of the wafer, and measuring the depth of the test trenches with a configuration measuring apparatus of a probe contact type.

The test trenches formed in this technique are of several types with different widths, among which a maximum width is about 100 μm because of the size of the probe for contact with the trenches. This technique comprises measuring the depth of the trenches having the respective widths by the use of the configuration measuring apparatus, obtaining a relationship between the trench widths and trench depths, and determining the depth of a trench having a width of 0.35 μm by extrapolation.

As mentioned above, the background art methods indirectly measure the trench depth and are not capable of obtaining the accurate trench depth. For example, if there is a problem in a manufacturing process of a semiconductor device and a desired trench is not formed, the background art methods cause the manufacturing process to proceed without correction, to manufacture a large number of finally defective products, resulting in the decrease in product yield.

SUMMARY OF THE INVENTION

It is an object of the present invention to provide a method of directly measuring a trench depth without damages to a wafer.

According to the present invention, a method of measuring the depth of a trench formed in a main surface of a semiconductor substrate includes the following steps (a) to (d).

The step (a) mixes standard particles into a solution of cellulose acetate in acetone to prepare a molding solution, the standard particles having a uniform diameter less than the width of the trench. The step (b) drops the molding solution onto the semiconductor substrate formed with the trench, and dries the molding solution into a solid state to form a negative replica having a projection corresponding in shape to the trench and a base corresponding to the main surface of the semiconductor substrate. The step (c) peels the negative replica off the semiconductor substrate. The step (d) measures the height of the projection of the negative replica by using a vertical difference obtained by changing a relative distance between a lens of a microscope and the negative replica with respect to a focus position of the microscope.

In the method according to the present invention, the standard particles are mixed in the negative replica having the projection corresponding in shape to the trench, to make the negative replica opaque. It is, hence, easy to determine where the focus position of the microscope is. It is accordingly easy to measure the height of the projection of the negative replica by using the vertical difference with respect to the focus position of the microscope. Therefore, this method can obtain the correct depth of the trench.

Preferably, in the method, the step (d) includes the step of placing the negative replica with the projection facing toward the lens on a stage movable in small steps in a vertical direction toward the lens of the microscope, and obtaining a vertical difference between a vertical position of the stage when a tip of the projection is at the focus position and a vertical position of the stage when a surface of the base is at the focus position to determine the height of the projection.

In the method according to the present invention, the vertical difference between the vertical position of the stage when the tip of the projection is at the focus position and the vertical position of the stage when the surface of the base is at the focus position is obtained as the height of the projection. This provides a practical method of measuring the trench depth.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 through 9 are views illustrating a method of preparing a negative replica in a step-by-step manner.

DESCRIPTION OF THE PREFERRED EMBODIMENT

<A. Feature of the Invention>

Description will now be given on a feature of a measuring method according to the present invention with reference to FIGS. 1 through 3, taking a trench for an isolating insulation film as an example.

Figure 1:
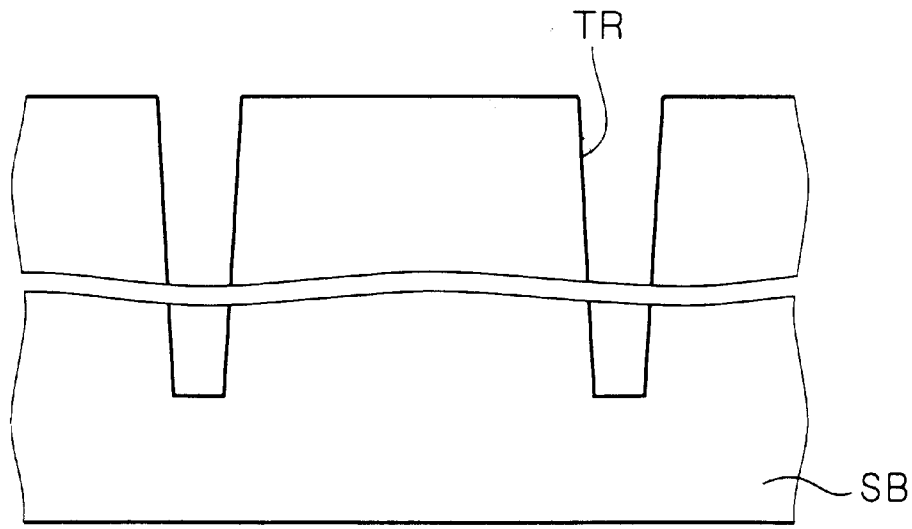
FIGS. 1 through 3 are views illustrating a feature of a method of measuring a trench depth of a semiconductor device in a step-by-step manner according to the present invention.

FIG. 1 is a sectional view showing a trench TR for an isolating insulation film formed in a main surface of a semiconductor substrate SB. The trench TR has a width of 0.35 μm and a depth of 3.5 μm as settings.

Next, in the step shown in FIG. 2, a solution (referred to hereinafter as a molding solution) SL is prepared which is a mixture of particles (referred to hereinafter as standard particles SP) commercially available under a label entitled Certified Particle Size Standards in a solution of cellulose acetate in acetone. The molding solution SL is dropped onto a region in which the trench TR is formed to fill the trench TR with the molding solution SL and to cover the main surface of the semiconductor substrate SB with a film of the molding solution SL.

The process of preparing the molding solution SL comprises adding an acetone solution and cellulose acetate in a solid state together in a ratio of about two to one by volume, permitting the resultant solution to stand for about one hour to completely dissolve the cellulose acetate, and mixing the standard particles SP in the resultant solution. The solution of cellulose acetate in acetone, when agitated, creates bubbles which, however, disappear when permitted to stand. The molding solution SL free from bubbles is dropped onto the semiconductor substrate SB.

An example of the standard particles SP used herein may include polystyrene particles available from Duke Scientific Corporation. The above-mentioned polystyrene particles are of a variety of diameters selectable in a range of 20 nm to 900 nm, and are being dispersed in pure water when furnished. In this preferred embodiment, since the trench TR is 0.35 μm in width, the use of polystyrene particles having a diameter of 20 nm to 100 nm reliably prevents clogging in the trench TR to allow the uniform dispersion of the polystyrene particles in the trench TR.

Mixing the standard particles SP in the molding solution SL may be carried out by dropping the standard particles SP being dispersed in the pure water into the molding solution SL. No definite limit is placed on the amount of dropping of the standard particles SP. However, since the addition of the standard particles SP aims to make the clear molding solution SL turbid and opaque, the amount of dropping may be suitably determined in accordance with the volume of the molding solution SL so that the molding solution SL becomes opaque with the standard particles SP diffused in the molding solution SL.

Since the polystyrene particles are white, the molding solution SL is opaque white. Some polystyrene particles available from Duke Scientific Corporation have fluorescent colors: green, red and blue. These colored polystyrene particles may be used.

Figure 2:
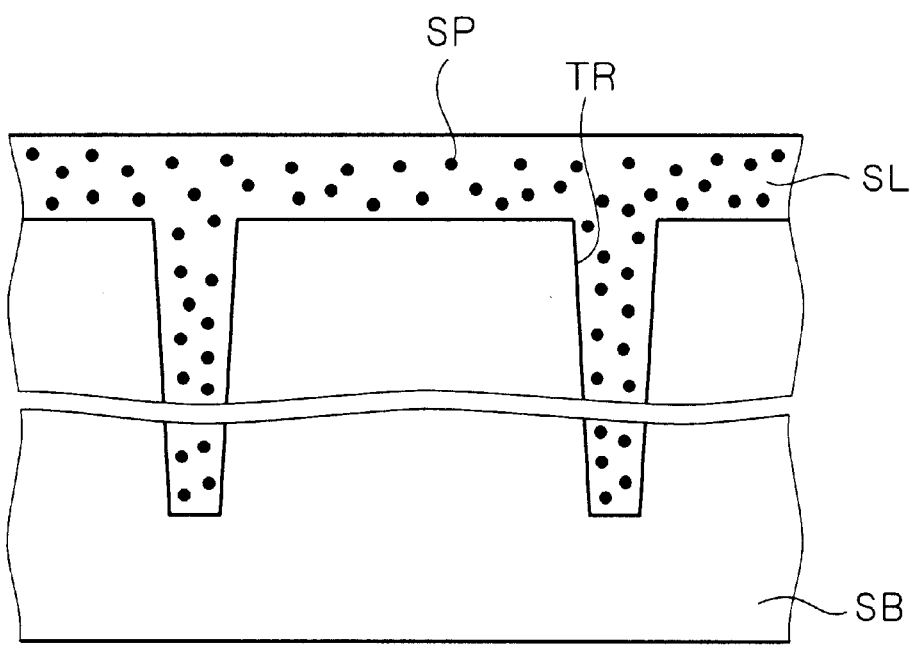

The molding solution SL with the standard particles SP mixed therein is shown in FIG. 2 as dried into a solid state on the semiconductor substrate SB.

Figure 3:
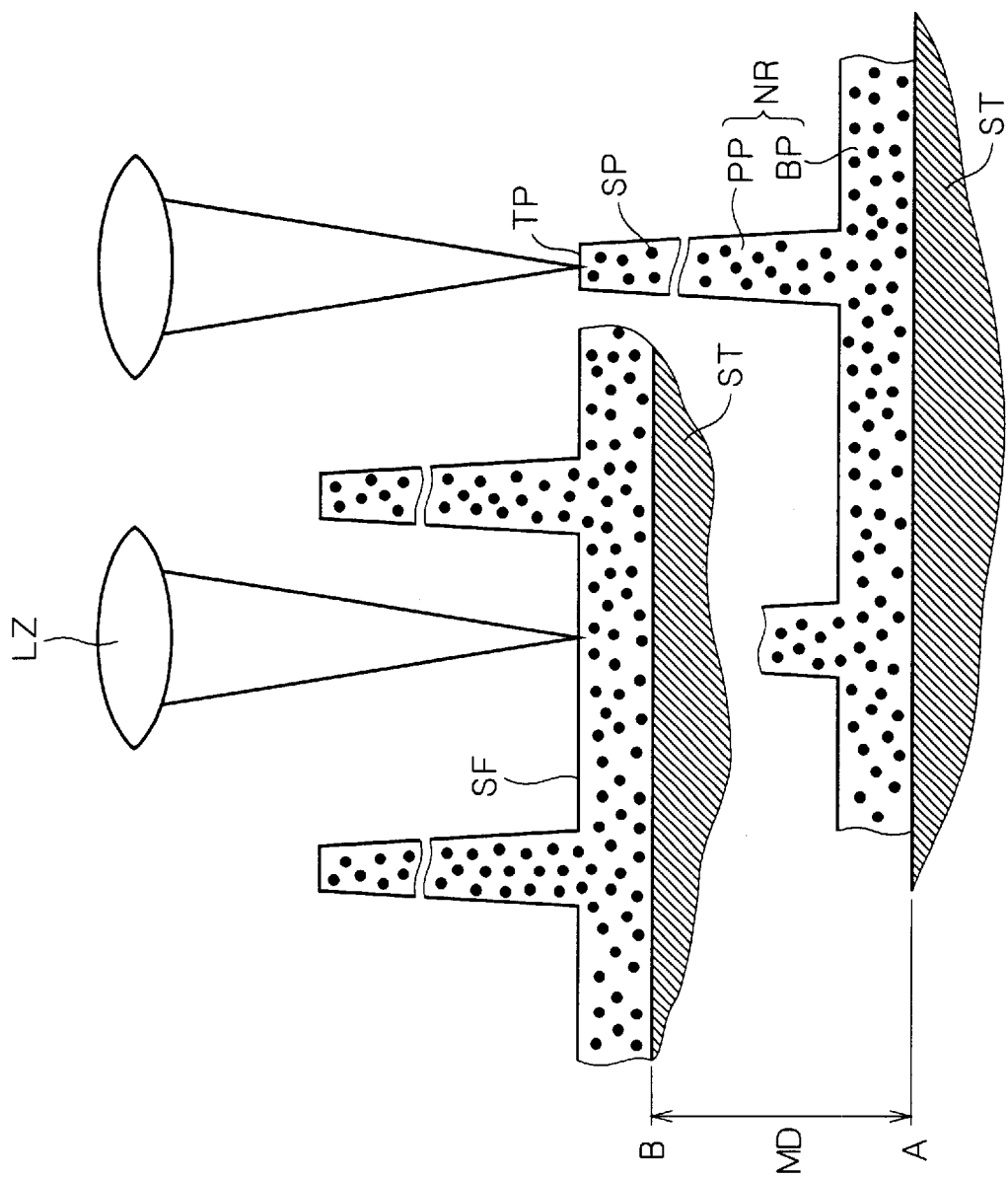

Next, as shown in FIG. 3, the molding solution SL dried into the solid state is peeled off the semiconductor substrate SB, and is placed on a stage ST of an optical microscope, with a projection PP corresponding to the trench TR positioned upside.

The solidified molding solution SL is referred to hereinafter as a negative replica NR because the projection PP has an inverted shape of the trench TR.

The negative replica NR has the projection PP corresponding to the trench TR, and a base BP corresponding to the film on the semiconductor substrate SB. A tip TP of the projection PP corresponds to a bottom position of the trench TR, and a surface SF of the base BP corresponds to a main surface position of the semiconductor substrate SB.

The stage ST of the microscope on which the negative replica NR is placed has a system movable in steps of 0.05 μm in a direction perpendicular to the lens surface. First, for example, the focus of the lens LZ of the microscope is adjusted so that the tip TP of the projection PP is plainly visible through the microscope, and a vertical position A of the stage ST at that time is identified. Next, with the lens LZ held at the same position, the stage ST is gradually moved toward the lens LZ and is stopped moving at a position where the surface SF of the base BP is plainly visible through the microscope. A vertical position B of the stage ST at that time is identified. Then, a difference between the vertical position B and the previously identified vertical position A is calculated to determine a distance MD moved. The distance MD corresponds to the height of the projection PP, i.e. the depth of the trench TR. Although two lenses LZ are shown in FIG. 3 for purposes of illustration, the single lens LZ is actually used.

Since the stage ST is driven by a motor-driven actuator or the like, information about the position thereof is represented in the form of digital information. Setting the vertical position A as a zero position allows the direct display of the distance MD as information about the vertical position B.

Although it has been described above that the stage ST is movable slightly in the direction perpendicular to the lens surface, the lens may have a system movable slightly toward the stage. In other words, the microscope may have a system capable of changing a relative distance between the stage and the lens in small steps and obtaining a distance the lens or the stage is moved.

<B. Functions and Effects>

As mentioned above, the molding solution SL is clear, and the negative replica NR will accordingly be clear without any processing. When the clear negative replica NR is observed under the optical microscope, there arises a situation such that whether the tip TP of the projection PP or the surface SF of the base BP is at a position in which focus is achieved (referred to hereinafter as a "focus position") is not judgeable, and the correct distance MD is not obtained.

A similar situation occurs even when a laser microscope is used in place of the optical microscope. Laser light entering the clear negative replica NR is scattered or reflected inside the negative replica NR. Not only light reflected from the surface of the negative replica NR but also light reflected from the inside thereof are detected to cause optical signal noises. This prevents the obtainment of the correct distance MD.

However, in the measuring method of this preferred embodiment, the standard particles SP are diffused in the negative replica NR to make the negative replica NR opaque. Thus, it is easy to judge whether the tip TP of the projection PP or the surface SF of the base BP is at the focus position. This allows the obtainment of the correct distance MD and, accordingly, the depth of the trench TR.

<C. Method of Preparing Negative Replica>

A method of preparing the negative replica will be described with reference to FIGS. 4 through 9.

First, the molding solution SL containing the standard particles SP is dropped onto the semiconductor substrate SB, and the semiconductor substrate SB is mounted on a heater HT. The molding solution SL enters the trench and spreads to some extent over the semiconductor substrate SB.

The molding solution SL may be dropped after the semiconductor substrate SB is mounted on the heater HT. In this case, it is desirable that the heater HT is at room temperature so as not to impair the spread of the molding solution SL.

Figure 5:

Then, the temperature of the heater HT is raised to about 40° C. (practical temperature ranging from 30 to 40° C.), and the heater HT heats the substrate SB for 10 to 20 minutes to dry the molding solution SL spread over the semiconductor substrate SB into a solid state, thereby molding the negative replica NR (FIG. 5).

Figure 6:
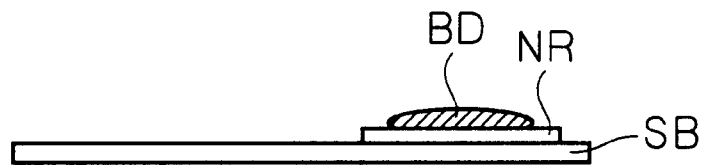

Next, in the step shown in FIG. 6, an instant adhesive (a commercially available adhesive which sets for one to three seconds, such as α-cyanoacrylate adhesive) BD is dropped onto the negative replica NR. Then, a bonding member JG is pressed against the instant adhesive BD so as to force the instant adhesive BD to spread, and is rotated to accelerate the drying of the instant adhesive BD. It takes one to two minutes to rotate the bonding member JG.

The bonding member JG has a circular body J1 made of metal, e.g. aluminum. One of the two flat surfaces of the body J1 is pressed against the instant adhesive BD. The other flat surface is formed with a threaded hole in which a handle J2 of the bonding member JG is screwed. A bolt or the like may be used for the handle J2.

After the bonding, the bonding member JG is left standing for about five minutes. Then, pulling the bonding member JG in a vertical direction as shown in FIG. 8 causes the negative replica NR sticking to the flat surface of the bonding member JG to be peeled off the semiconductor substrate SB (FIG. 9). It is needless to say that the negative replica NR is formed with the projection PP corresponding to the trench TR described with reference to FIG. 3.

The use of the bonding member JG as the stage of the optical microscope eliminates the need to carry out the process of peeling the negative replica NR off the bonding member JG.

Thus, the process of forming the negative replica NR is simple, and the entire process requires about 30 minutes. This shortens the time for measuring the trench depth.

The negative replica NR and the instant adhesive BD remaining on the semiconductor substrate SB are easily removed by the use of a solvent. The remaining manufacturing steps are performed on the semiconductor substrate SB for which the trench depth is measured, to complete a semiconductor device.

<D. Modification of Method of Preparing Negative Replica>

The above-mentioned method of preparing the negative replica comprises dropping the instant adhesive BD onto the negative replica NR containing the standard particles SP. However, there is a likelihood that the standard particles SP which are polystyrene particles, when contained in the instant adhesive BD, reduce the bonding effect. In such a case, another technique to be described below may be employed.

Figure 4:
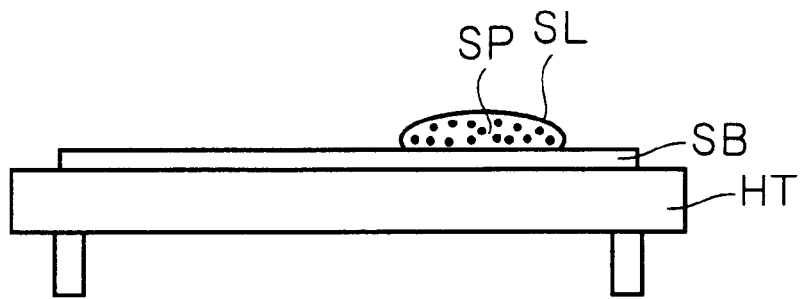
Figure 10:
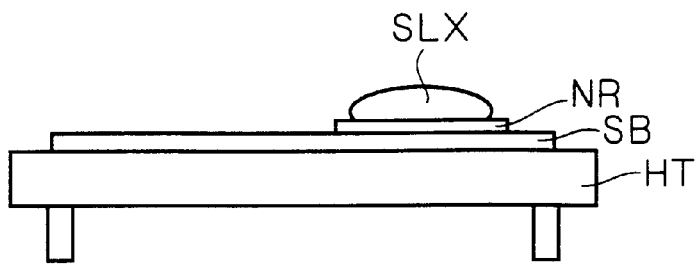
FIGS. 10 through 13 are views illustrating a modification of the method of preparing a negative replica in a step-by-step manner.
Figure 11:
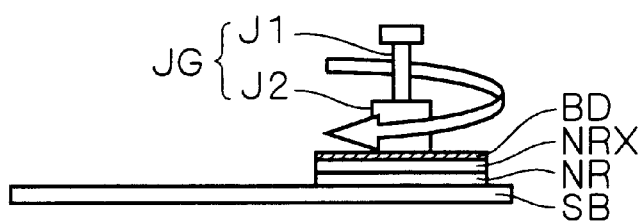

The steps described with reference to FIGS. 4 and 5 are performed to form the negative replica NR containing the standard particles SP on the semiconductor substrate SB. Next, as shown in FIG. 10, a molding solution SLX free from the standard particles SP is dropped onto the negative replica NR, and the semiconductor substrate SB is mounted on the heater HT.

The temperature of the heater HT is raised to about 40° C. (temperature ranging from 30 to 40° C.), and the heater HT heats the substrate SB for 10 to 20 minutes to dry the molding solution SLX spread over the negative replica NR into a solid state, thereby molding a negative replica NRX. The negative replica NR and the negative replica NRX contain the same ingredients except the presence and absence of the standard particles SP. The negative replica NRX firmly adheres to the negative replica NR. The negative replica NRX is not intended for molding but for preventing the reduction in bonding strength of the bonding member JG, and may be referred to as a bonding assistant layer.

Figure 12:
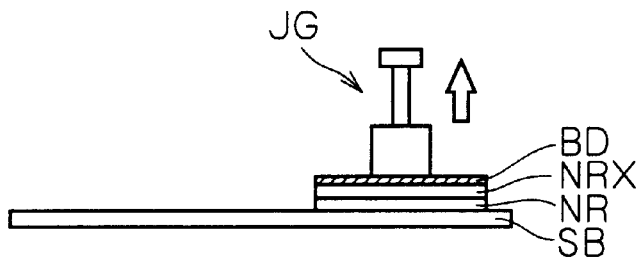

Next, in the step shown in FIG. 12, the instant adhesive BD is dropped onto the negative replica NRX. Then, the bonding member JG is pressed against the instant adhesive BD so as to force the instant adhesive BD to spread, and is rotated to accelerate the drying of the instant adhesive BD. It takes one to two minutes to rotate the bonding member JG. Since the negative replica NRX does not contain the standard particles SP, the instant adhesive BD is not reduced in bonding strength but strongly bonds the bonding member JG and the negative replica NRX together.

Figure 13:
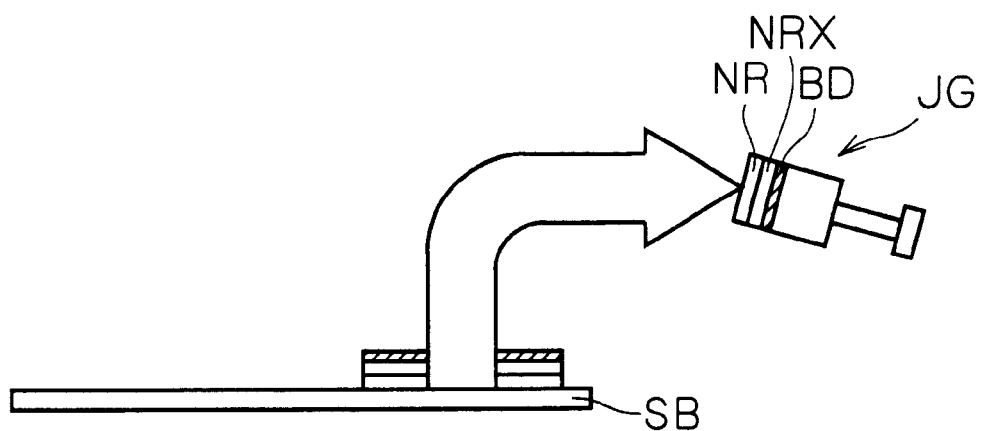

After the bonding, the bonding member JG is left standing for about five minutes. Then, pulling the bonding member JG in a vertical direction as shown in FIG. 12 causes the negative replica NR sticking to the flat surface of the bonding member JG to be peeled off the semiconductor substrate SB (FIG. 13). It should be noted that the negative replica NRX is present between the negative replica NR and the instant adhesive BD.

As described above, the negative replica NRX free from the standard particles SP is formed on the negative replica NR, and the instant adhesive BD is dropped onto the negative replica NRX. This prevents the reduction in bonding strength of the instant adhesive BD to ensure the peeling of the negative replica NR from the semiconductor substrate SB.

While the invention has been described in detail, the foregoing description is in all aspects illustrative and not restrictive. It is understood that numerous other modifications and variations can be devised without departing from the scope of the invention.

What is claimed is:

1. A method of measuring the depth of a trench formed in a main surface of a semiconductor substrate, said method comprising the steps of:

(a) mixing standard particles into a solution of cellulose acetate in acetone to prepare a molding solution, said standard particles having a uniform diameter less than the width of said trench;

(b) dropping said molding solution onto said semiconductor substrate formed with said trench, and drying said molding solution into a solid state to form a negative replica having a projection corresponding in shape to said trench and a base corresponding to said main surface of said semiconductor substrate;

(c) peeling said negative replica off said semiconductor substrate; and (d) measuring the height of said projection of said negative replica by using a vertical difference obtained by changing a relative distance between a lens of a microscope and said negative replica with respect to a focus position of said microscope.

2. The method according to claim 1, wherein said step (d) comprises the step of placing said negative replica with said projection facing toward said lens on a stage movable in small steps in a vertical direction toward said lens of said microscope, and obtaining a vertical difference between a vertical position of said stage when a tip of said projection is at the focus position and a vertical position of said stage when a surface of said base is at the focus position to determine said height of said projection.

3. The method according to claim 1, wherein said step (a) comprises the steps of:
- adding an acetone solution and cellulose acetate together in a ratio of about two to one by volume to prepare said solution of cellulose acetate in acetone; and
- dropping and mixing polystyrene particles dispersed in pure water as said standard particles into said solution of cellulose acetate in acetone.

4. The method according to claim 3, wherein said polystyrene particles have a diameter of 20 to 100 nm.

5. The method according to claim 1, wherein said step (b) comprises the step of heating said semiconductor substrate with said molding solution dropped thereon at a temperature ranging from 30 to 40° C. for 10 to 20 minutes.

6. The method according to claim 1, wherein said step (c) comprises the steps of:
- dropping an instant adhesive onto said negative replica sticking to said main surface of said semiconductor substrate, and pressing a flat surface of a bonding member for bonding to said negative replica against said instant adhesive to bond said bonding member to said negative replica; and
- pulling up said bonding member in a direction perpendicular to said main surface of said semiconductor substrate to peel said negative replica off said semiconductor substrate.

7. The method according to claim 1, wherein said step (c) comprises the steps of:
- dropping said solution of cellulose acetate in acetone free from said standard particles onto said negative replica sticking to said main surface of said semiconductor substrate, and drying said solution of cellulose acetate in acetone free from said standard particles into a solid state to form a bonding assistant layer firmly adhering to said negative replica;
- dropping an instant adhesive onto said bonding assistant layer, and pressing a flat surface of a bonding member for bonding to said adhesive assistant layer against said instant adhesive to bond said bonding member to said bonding assistant layer; and
- pulling up said bonding member in a direction perpendicular to said main surface of said semiconductor substrate to peel said negative replica with said bonding assistant layer off said semiconductor substrate.

* * * * *